United States Patent
Werker

(10) Patent No.: US 7,622,966 B2
(45) Date of Patent: Nov. 24, 2009

(54) SWITCHABLE PHASE LOCKED LOOP AND METHOD FOR THE OPERATION OF A SWITCHABLE PHASE LOCKED LOOP

(75) Inventor: Heinz Werker, Huglfing (DE)

(73) Assignee: National Semiconductor Germany AG, Unterhaching (DE)

( * ) Notice: Subject to any disclaimer, the term of this patent is extended or adjusted under 35 U.S.C. 154(b) by 0 days.

(21) Appl. No.: 11/751,871

(22) Filed: May 22, 2007

(65) Prior Publication Data
US 2007/0274425 A1 Nov. 29, 2007

(30) Foreign Application Priority Data
May 24, 2006 (DE) ................. 10 2006 024 470

(51) Int. Cl.
*H03L 7/06* (2006.01)
(52) U.S. Cl. ................................ 327/156; 327/147
(58) Field of Classification Search ........ 327/146–150, 327/156–159
See application file for complete search history.

(56) References Cited

U.S. PATENT DOCUMENTS

| | | | | |
|---|---|---|---|---|
| 4,929,886 A * | 5/1990 | Toshiyuki | ...... | 324/691 |
| 5,260,979 A * | 11/1993 | Parker et al. | ...... | 375/366 |
| 5,512,860 A * | 4/1996 | Huscroft et al. | ...... | 331/1 A |
| 5,950,115 A * | 9/1999 | Momtaz et al. | ...... | 455/73 |
| 5,982,239 A * | 11/1999 | Takahashi et al. | ...... | 331/11 |
| 6,147,530 A * | 11/2000 | Nogawa | ...... | 327/156 |
| 6,313,708 B1 * | 11/2001 | Beaulieu | ...... | 331/17 |
| 6,559,696 B1 * | 5/2003 | Heitmann et al. | ...... | 327/156 |
| 6,657,464 B1 * | 12/2003 | Balardeta et al. | ...... | 327/147 |
| 6,703,877 B2 * | 3/2004 | Kobayashi et al. | ...... | 327/156 |
| 6,741,109 B1 | 5/2004 | Huang et al. | | |
| 6,828,865 B2 * | 12/2004 | Yamane et al. | ...... | 331/25 |
| 6,867,627 B1 * | 3/2005 | Murtagh | ...... | 327/158 |
| 7,030,688 B2 * | 4/2006 | Dosho et al. | ...... | 327/558 |
| 7,155,191 B2 * | 12/2006 | Wego et al. | ...... | 455/265 |
| 7,279,945 B2 * | 10/2007 | Hou et al. | ...... | 327/156 |
| 2002/0061088 A1 * | 5/2002 | Kon | ...... | 375/376 |
| 2004/0095863 A1 * | 5/2004 | Verboom et al. | ...... | 369/47.28 |
| 2005/0200391 A1 * | 9/2005 | Steinbach et al. | ...... | 327/156 |

FOREIGN PATENT DOCUMENTS

DE 199 46 502 C1 5/2001

* cited by examiner

*Primary Examiner*—Lincoln Donovan
*Assistant Examiner*—Thomas J Hiltunen
(74) *Attorney, Agent, or Firm*—Pearne & Gordon LLP

(57) ABSTRACT

The invention relates to a phase locked loop or "PLL" (12) and a method for the operation of a PLL (12), wherein a controllable oscillator (DCO) generates an output signal (CKout) and can be switched over between a first clock signal (CKin1 or CKin2) and a second clock signal (CKin2 or CKin1) for use as the input clock signal of the PLL (12). According to the invention, for the clock signal (CKin1 or CKin2) currently being used to generate the output signal (CKout), a phase difference between this clock signal and the output signal (CKout) is determined and used for the control of the oscillator (DCO), whereas for the clock signal (CKin2 or CKin1) currently not being used to generate the output signal (CKout), its frequency difference with respect to the output signal (CKout) is determined and stored and continuously updated and provided for the control of the oscillator (DCO) after the switch-over to this clock signal previously not being used. The PLL output signal (CKout) can thus follow more quickly any switch-over-related frequency change of the clock signal being used.

3 Claims, 5 Drawing Sheets

SWITCHABLE PHASE LOCKED LOOP AND METHOD FOR THE OPERATION OF A SWITCHABLE PHASE LOCKED LOOP

BACKGROUND OF THE INVENTION

1. Field of the Invention

The present invention relates to a phase locked loop with a controllable oscillator for generating an output signal of the phase locked loop and with a switch-over device for switching over between a first clock signal and a second clock signal for use as the input clock signal of the phase locked loop.

Further, the invention relates to a method for the operation of a phase locked loop, wherein a controllable oscillator generates an output signal of the phase locked loop and can be switched over between a first clock signal and a second clock signal for use as the input clock signal of the phase locked loop.

2. Description of the Prior Art

Such a phase locked loop, referred to in short hereinafter as "PLL", and such an operating method for a PLL are known for example from U.S. Pat. No. 6,741,109.

Quite generally, a PLL serves to synchronise a controllable oscillator, which generates an output signal with an output frequency, by means of a feedback with an input clock signal with an input frequency. For this purpose, the PLL comprises a phase detector or phase comparator, at the input whereof the input clock signal and the PLL output signal are present. A signal representing the phase difference between these two signals is usually used to control the oscillator via an active or passive, digital or analog filter ("loop filter").

The areas of application of PLL switching circuits are diverse. For example, PLLs can be used for clock recovery from digital signal sequences or FM demodulation. In communication standards such as "SONET" and "SDH", clock generation circuits are required for generating clock signals when sending and receiving data. In such a circuit, a PLL circuit can generate, e.g. from an input clock signal inputted as a reference, one or more output clock signals for use in a communication system. The synchronisation of the PLL output signal to an input clock signal does not necessarily mean here that the frequencies of these two signals are identical. On the contrary, a more or less arbitrary frequency ratio can be provided in a manner known per se by means of an arrangement of frequency dividers at the input and/or at the output and/or in the feedback path of the PLL circuit.

The present invention, as also the aforementioned U.S. Pat. No. 6,741,109, proceeds from the fact that, in such a PLL, it is possible to switch between a first clock signal and a second clock signal for use as an input clock signal of the PLL. This in no way rules out the fact that more than two clock signals can be used as an input clock signal of the PLL. On the contrary, it is essential that, from a number of clock signals, only one clock signal is always selected and actually used to generate the PLL output signal. The provision of a number of clock signals may be advantageous in particular to create a redundancy in a communication system. If, for example, one of the clock signals serving as a reference "gets lost", a switch-over to another clock signal for use as an input clock signal of the PLL can take place in the PLL circuit of the clock generation circuit. Especially for the use of the PLL in communication systems for clock generation or clock recovery, it is desirable here that no significant phase change ("phase hit") takes place in the PLL output signal due to such a switch-over procedure. Such a phase change can however occur if the first and second clock signals possess different phases immediately before the switch-over.

A known possibility of avoiding abrupt phase changes as a result of a switch-over procedure consists in selecting the PLL bandwidth ("loop gain") very small (for the aforementioned communication systems, for example, in the order of magnitude of several Hz). In this case, the phase of the PLL output signal changes only very slowly, even if the clock signals between which switching-over takes place have a relatively large phase difference immediately before the switch-over. No data transfer errors then occur in the mentioned communication systems. This solution, however, has in particular the following two drawbacks: on the one hand, a particularly small PLL bandwidth is difficult to produce in an integrated circuit arrangement. On the other hand, a disadvantageously smaller capture range of the PLL also results from a small PLL bandwidth. The PLL capture range may for example be less than 1 ppm for a PLL bandwidth of several Hz.

In order to avoid phase changes of the PLL output signal due to a switch-over procedure and in order to guarantee "hitless switching", it is proposed in the aforementioned U.S. Pat. No. 6,741,109 that, for the clock signal currently not being used to generate the output signal, the phase difference of said clock signal with respect to a feedback signal derived from the PLL output signal is ascertained and stored. When a switch-over to this clock signal takes place, the stored phase difference is injected at a suitable point into the PLL in order to compensate for the phase difference. With this solution, the accuracy of the compensation achievable in practice and the circuit outlay required for the compensation is problematic.

Irrespective of this, it is problematic with the known solution if the clock signals between which the switch-over is to take place have frequencies that differ significantly from one another. In the case of such a frequency difference, it would be desirable for the oscillation frequency of the oscillator to change correspondingly "immediately" or abruptly when the switch-over takes place. The known solution based on an "observation of the phase difference" is not however capable of achieving this, since the information concerning the phase difference between two signals existing at a specific time does not possess any informative value concerning a frequency difference that may exist between these signals. When a switch-over takes place between two clock signals with a frequency differing from one another, the PLL output signal will ultimately adjust to the frequency of the currently used clock signal, but this adjustment requires a more or less long time, which is not available for many areas of application.

SUMMARY OF THE INVENTION

It is an object of the present invention to improve a phase locked loop and a method of the initially stated type such that the PLL output signal can rapidly follow any frequency change of the clock signal being used caused by the switch-over.

The phase locked loop according to the invention is characterised in that a phase detector which can switch over between different operating modes is provided in each case for the two clock signals, wherein the phase detector for the clock signal currently being used is put into a first operating mode and the phase detector for the clock signal currently not being used is put into a second operating mode, and wherein each phase detector in the first operating mode determines a phase difference between the clock signal being used and the output signal and makes the latter available for the control of the oscillator and, in the second operating mode, a frequency difference between the clock signal not being used and the output signal is determined and stored and continuously updated and made available for the control of the oscillator after the switch-over to this clock signal previously not being used.

The operating procedure according to the invention is characterised in that, for the clock signal currently being used to generate the output signal, a phase difference between this clock signal and the output signal is determined and used for the control of the oscillator, whereas for the clock signal currently not being used to generate the output signal, its frequency difference with respect to the output signal is determined and stored and continuously updated and made available for the control of the oscillator after the switch-over to this clock signal previously not being used.

Switch-over-related frequency changes at the input of the phase locked loop can be handled better and the quality of the PLL output signal can thus be improved with the invention. The oscillator used in the PLL can immediately be adjusted correspondingly in its oscillation frequency at the time of the switch-over by means of the information concerning the frequency difference already determined, stored and continuously updated before the switch-over. To advantage, this can be achieved with relatively low outlay in terms of circuitry.

In a preferred embodiment of the invention, moreover, any phase difference present between the plurality of clock signals usable as the input clock signal can be adapted or compensated for before the switch-over, so that an undesired phase change in the PLL output signal due to the switch-over can also be avoided. It is obvious that there is a tendency for the precision and quality of such a "hitless switching" measure to be improved by taking a frequency difference present before the switch-over into account in accordance with the invention. In other words, the frequency adaptation according to the invention reduces the requirements on a phase adaptation provided for the "hitless switching" and the use of the frequency adaptation according to the invention improves the performance of a preset phase adaptation.

A further advantage of the invention consists in the fact that the latter does not make any special requirements on the PLL bandwidth, i.e. it can be used both for relatively low and for relatively high PLL bandwidths.

Provision is made in an embodiment of the invention such that the phase detector has an integrator, into which a signal dependent on the phase difference between the clock signal not being used and the PLL output signal is inputted in the second operating mode of the phase detector, in order to make available at its output a signal representative of the frequency difference.

With such an integrator, the determination, storage and continuous updating of the signal representative of the frequency difference can be achieved in a particularly simple manner from the circuitry standpoint.

In a development of this, provision can be made such that the signal inputted into the integrator is made available as an output signal of a phase comparison device, which compares the phase of the clock signal not being used with a version of the output signal which is adjusted phase-shifted, the phase shift being adjusted on the basis of the output signal of the phase comparison device.

The integrator can for example be a component of a feedback filter, which is arranged in a feedback path from the output of the phase comparison device to the input of the phase shift device, which subjects the output signal to a phase shift before the phase comparison. In a manner of speaking, there can be provided in each phase detector an "internal phase locked loop" activated solely in the second operating mode, whose control deviation signal is integrated and used at the output of the integrator as the signal representative of the frequency difference.

Provision is made in an embodiment of the invention such that the phase difference between the clock signal being used and a version of the output signal adjusted phase-shifted is provided as the phase difference determined by each phase detector in the first operating mode, and wherein each phase detector adjusts this phase shift in the second operating mode.

By means of this measure, the initially mentioned "hitless switching" can be achieved and the quality of the PLL output signal can be further improved for many areas of application. With this development of invention, any phase difference present between the usable clock signals at the time of the switch-over is also adapted or compensated for before the switch-over.

Provision can be made here, for example, such that the PLL output signal is made available with a number of phases and the phase-shifted version of the output signal is generated by means of an adjustable interpolation between these phases. With the PLL according to the invention, this can be achieved for example by the fact that the oscillator is designed to make the output signal available with a number of phases for the phase detector, wherein the phase detector comprises:

an adjustable phase interpolator for the interpolation between these phases and for making available a signal adjusted interpolated, and a phase comparison device for comparing the phase of the clock signal with the phase of the interpolated signal and for making available a phase detector output signal representing the phase difference.

Coming back once again to the determination, storage and continuous updating of the frequency difference provided for according to the invention, it has already been explained above that an "internal phase locked loop" of the phase detector can be used for this, which is active only in the second operating mode of the phase detector. Such an internal phase locked loop can also be used to advantage for the phase adaptation explained above (for "hitless switching"), which is also to be carried out, as the case may be, solely in the second operating mode of the phase detector. One and the same internal phase locked loop of a phase detector currently not being used can thus be used to deliver in the second operating mode a signal representative of the frequency difference and a signal representative of the phase difference. In a preferred development of this concept, provision is made such that the frequency difference signal is picked up at the output of an integrator, which is a component of the feedback filter concerned. A "proportional path" can for example be disposed parallel to such an "integral path" of the filter.

As for the manner of taking account of the stored and continuously updated frequency difference signal during the switch-over of the PLL to the clock signal previously not being used, provision is made in a preferred embodiment such that this frequency difference signal is fed via a superimposition element (e.g. adder) to a control input of the oscillator, at which the frequency difference signal is superimposed with the phase detector output signal. The phase detector output signal is the "conventional oscillation control signal" for PLLs and can be delivered for example by a switch-over device, which is designed as a multiplex device and which is connected to all the phase detectors, via a conventional PLL filter ("loop filter") to the oscillator (e.g. DCO or VCO). The mentioned superimposition element can be provided in the signal path before or after such a PLL filter. The mentioned "conventional PLL filter" can be formed for example by a parallel arrangement of a proportional path and an integral path, the signals originating from these two paths being superimposed (e.g. by means of an adder).

BRIEF DESCRIPTION OF THE DRAWINGS

The invention will be described in greater detail below with the aid of an example of embodiment by reference to the appended drawings. In the drawings.

DESCRIPTION OF THE PREFERRED EMBODIMENT(S)

Figure 1:
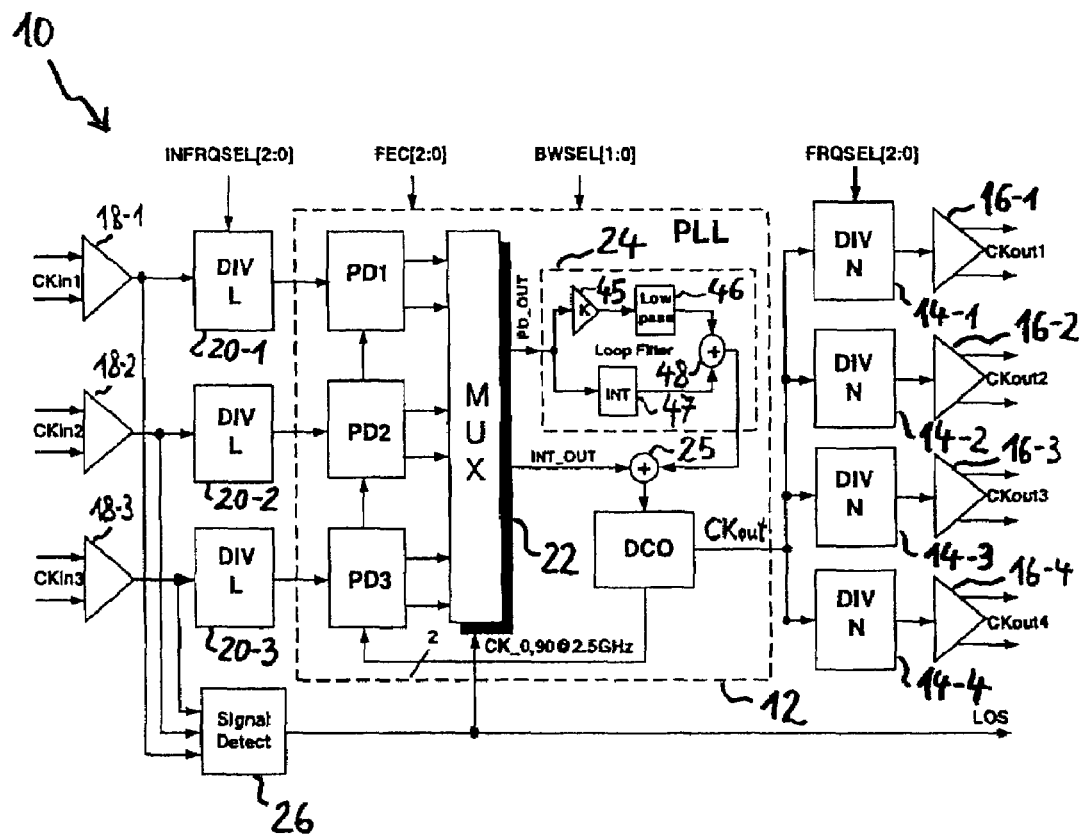
FIG. 1 shows a PLL circuit.

FIG. 1 shows a PLL circuit 10 with a PLL (phase locked loop) 12.

PLL 12 comprises a digitally controllable oscillator DCO for generating an output signal CKout or a two-phase version of this output signal with two phases CK_0 and CK_90. The two signals CK_0, CK_90 have a fixed phase difference of 90° with respect to one another and fixed phase differences with respect to output signal CKout. In the simplest case, signal CKout is identical to one of signals CK_0 and CK_90.

In the example of embodiment shown, PLL output signal CKout is fed to a number of output dividers 14-1 to 14-4, which subject to the PLL output signal in each case to a frequency division with a preset division ratio and output the same to output stages 16-1 to 16-4, which convert the signal in each case into a differential output clock signal CKout1 to CKout4.

At the input side, a number of differential clock signals CKin1 to CKin3 are fed to circuit 10, said signals first being converted in each case by three input stages 18-1 to 18-3 into a non-differential representation and inputted via three input dividers 20-1 to 20-3 into PLL 12.

As shown, a phase detector PD1, PD2 and PD3 is provided respectively for each of clock signals CKin1 to CKin3, also referred to hereinafter as "input signal CKin".

Each of these phase detectors PD1 to PD3, also referred to hereinafter as "phase detector PD", is able in a specific operating mode ("first operating mode") to determine a phase difference between clock signal CKin concerned (or the version thereof frequency-divided by means of dividers 20-1, 20-2 and 20-3) and a version of output signal CKout adjusted phase-shifted and to make the same available for the control of the digitally controlled oscillator DCO. For this purpose, the outputs of phase detectors PD are connected to a multiplex or switch-over device 22, which is designed to select one of the three output signals outputted by phase detectors PD1 to PD3 and to output the same to a PLL filter 24. In the example of embodiment shown, each phase detector PD in its first operating mode generates a phase detector output signal digitally representing this phase difference, which signal is filtered by PLL filter 24 designed digitally in this example of embodiment and outputted via an adder 25 to a control input of oscillator DCO. Furthermore, each phase detector PD in its first operating mode outputs a signal referred to in the following as integrator output signal INT_OUT, which was determined, stored and continuously updated in the phase detector in the manner described below during the period in which the phase detector was in a "second operating mode" (which will also be described further below). Signals INT_OUT and the phase detector output signal, also referred to hereinafter as PD_OUT, are fed to an adder 25 in order to superimpose these signals additively. The frequency of PLL output signal CKout outputted by the DCO is controlled by the signal outputted by adder 25.

Switch-over device 22 is connected to all the phase detectors PD1, PD2 and PD3 and, depending on the switching state, relays the signals outputted by a specific one of these phase detectors to digital filter 24 and adder 25.

By means of switch-over device 22, it is thus possible to switch over between the three clock signals CKin1 to CKin3 for use as the input clock signal of the PLL. Each such switch-over is initiated by a signal acquisition device 26, which receives at the input side, as shown, clock signals CKin1 to CKin3 and is connected at the output side to switch-over device 22. Device 26 detects the quality of clock signals CKin and makes a decision on the basis of this acquisition as to which of the clock signals is to be used as the PLL input clock signal or to which other input clock signal a switch-over is to be carried out if the clock signal currently being used becomes unusable. The latter circumstance is also communicated by means of a signal LOS to other (not shown) circuit parts of an integrated circuit arrangement, which also comprises represented PLL switching circuit 10.

Figure 2:
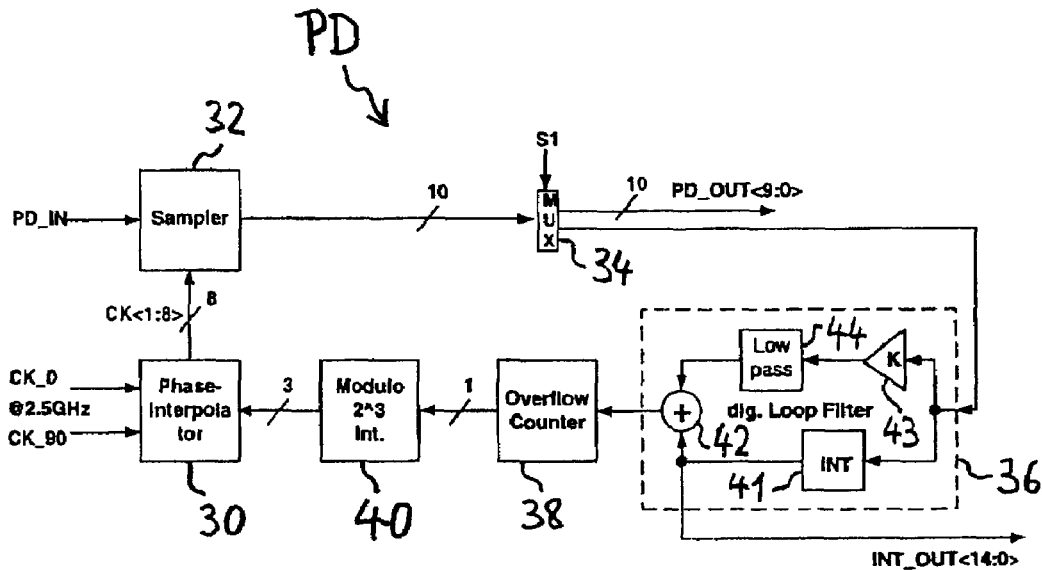
FIG. 2 shows the structure of the phase detectors used in the PLL circuit from FIG. 1.

FIG. 2 illustrates the (identical) structure of the three phase detectors PD1, PD2 and PD3. On account of the identical structure of the three phase detectors, this structure will be described solely for one phase detector PD by reference to FIG. 2. In switching circuit 10 shown in FIG. 1, all the components and signals described below for phase detector PD are accordingly present in each case separately for each of phase detectors PD1 to PD3.

The main components for the aforementioned first operating mode of phase detector PD are an adjustable phase interpolator 30 and a sampler device 32. The two "quadrature signals" CK_0, CK_90 of PLL output signal CKout are inputted into phase interpolator 30. Corresponding to an interpolation adjustment described below, interpolator 30 generates a signal CK<1:8> adjusted interpolated, which is fed as an input signal to sampler device 32. In the example of embodiment shown, phase interpolator 30 interpolates between the two sinusoidal quadrature clock signals CK_0, CK_90 of the DCO, which oscillates at a frequency around 2.5 GHz. Signal representation CK<1:8> comprises eight signal components and represents a (according to the interpolation adjustment) "phase-shifted version of the PLL output signal" CKout. Sampler device 32 has the function of a phase comparator and compares the phase-shifted version CK<1:8> of output signal CKout (fed as quadrature signal components CK_0 and CK_90 to phase detector PD) with the phase of a phase detector input signal PD_IN. As a result of this comparison, sampler device 32 outputs a digital signal representation PD_OUT<9:0>, which is fed in the first operating mode of phase detector PD via a phase detector switch-over device 34 to the phase detector output, which is connected to PLL switch-over device 22 (FIG. 1). Phase detector input signal PD_IN represented in FIG. 2 is one of the signals that is outputted by output dividers 20-1 to 20-3 represented in FIG. 1.

Returning once again to FIG. 1, it is for example assumed in the following that, initiated by signal acquisition device 26 and implemented by PLL switch-over device 22, clock signal CKin1 is currently being used as the input clock signal of PLL 12 and a switch-over to clock signal CKin2 is to take place at a later time. In this situation, phase detector PD1 is in its first operating mode, which has already been explained above by reference to FIG. 2. The two other phase detectors PD2 and PD3, however, are in the second operating mode described again below by reference to FIG. 2, in which operating mode the latter do not make an input clock signal available for the PLL, but on one hand bring about a "phase adaptation" (for "hitless switching") and on the other hand a "frequency adaptation" (for a rapid frequency adjustment of oscillator DCO). More precisely, there is established in each phase detector, which is in its second operating mode, on the one hand the extent of the aforementioned phase shift ("phase-shifted version of output signal CKout"), which is to be used in the following first operating mode, and on the other hand the aforementioned integrator output signal INT_OUT, which will then also actually be used for the subsequent first operating mode.

The switch-over of phase detector PD shown in FIG. 2 from its first operating mode into its second operating mode is brought about by a signal S1 outputted by signal acquisition device 26 or PLL switch-over device 22, said signal controlling phase detector switch-over device 34 in such a way that phase detector output signal PD_OUT<9:0> outputted by sampler device 32 is no longer outputted as a reference clock to the PLL, but retroacts on phase interpolator 30 via a feedback path provided in phase detector PD. In the example of embodiment shown, this feedback path is formed by a digital filter 36, an overflow counter 38 and a modulo-8-integrator 40.

In the second operating mode, phase detector output signal PD_OUT<9:0> is fed via digital filter 36 to an input of overflow counter 38, which with each counter overflow outputs an output pulse to modulo-8-integrator 40. At the output side, integrator 40 outputs an adjustment signal for adjustable phase interpolator 30, for which eight different signal states corresponding to eight different interpolation stages are provided.

On account of the fact that, in the second operating mode of phase detector PD, the adjustment of phase interpolator 30 influences the phase of signal CK<1:8> and thus indirectly influences phase detector output signal PD_OUT<9:0> used for the interpolation adjustment, a phase control is carried out in phase detector PD, wherein the adjustment outputted by integrator 40 is varied until a state is reached in which the phase detector output signal is controlled at a value which corresponds to a phase difference of zero. If phase detector PD is active and is included in the PLL loop, the whole feedback path 36, 38, 40 is inactive.

This phase control is carried out in all phase detectors PD currently not being used for the generation of the PLL output signal. A, so to speak, "internal phase adjustment" with respect to the PLL output signal is thus created for all the different clock signals CKin, before switching-over between clock signals CKin for use as the PLL input clock signal takes place. The function of this internal phase control, which takes place in the second operating mode of each phase detector PD, can be thought of, so to speak, as a "PLL inside the phase detector". The function of a digitally controllable oscillator of this "internal PLL" is made available with components 38, 40, 30.

If, in PLL circuit 10 (FIG. 1), a switch-over takes place to a clock signal previously not being used for the PLL output signal generation, internal switch-over device 34 in the phase detector PD concerned is transposed by signal S1 in such a way that phase detector output signal PD_OUT<9:0> is fed to PLL filter 24 via PLL switch-over device 22 which is also correspondingly switched over. On account of the preceding adjustment of phase interpolator 30 carried out by means of the "internal PLL" in a controlled manner, this switch-over does not lead to a disadvantageous phase change in the PLL output signal (as would be expected if phase interpolator 30 had not previously been adjusted accordingly).

Irrespective of this "phase adjustment", a "frequency adjustment" is also provided when the switch-over to a clock signal not previously being used takes place, since, at the moment of the switch-over for controlling oscillator DCO, not only the phase detector output signal fed by switch-over device 22 via filter 24 and adder 25, but also integrator output signal INT_OUT cooperate in the oscillator control on account of the superposition at adder 25. Any frequency jump during the switch-over between two input clock signals CKin produces, via additional signal INT_OUT, an immediate corresponding adjustment of the oscillator. For this purpose, signal INT_OUT fixed in the second operating mode is fixed and updated as a (here digital) representation of the frequency difference between the clock signal not being used and the PLL output signal.

In the example of embodiment shown, the "internal PLL" (cf. FIG. 2), which is in any case present for the phase adaptation in the second operating mode, is also used to advantage for the generation, storage and updating of signal INT_OUT provided for the frequency adaptation. As can be seen from FIG. 2, this signal is derived from feedback filter 36, more precisely as an output signal of an integrator 41, whose input (only in the second operating mode) receives the output signal of sampler device 32. Integrator 41 forms an "integral branch", which together with a "proportional branch" and an adder 42 forms filter 36, as shown in FIG. 2. In the example of embodiment shown, the proportional branch is formed by a linear element 43 (e.g. amplifier) and a low-pass filter 44. It is essential for the function of the frequency adaptation during the switch-over between different PLL input signals that the output signal of integrator 41 designated as INT_OUT is representative of the frequency difference to be determined. On account of the described implementation of the phase adaptation using the "internal PLL", the signal required for the frequency adaptation is, so to speak, obtained as a by-product of this circuit-related implementation.

It is essential for the function of described PLL switching circuit 10 to use a PLL 12, in which switching-over can take place between a number of clock signals for use as the input clock signal of the PLL, wherein the PLL phase detector currently being used compares a phase of feedback signal CKout (the phase of the feedback signal adjusted phase-shifted) with the phase of the input signal currently being used and phase detectors currently not being used in this period already carry out an adjustment of the frequency shift, which in the event of their use as a PLL phase detector is used as an "initial adjustment". In the described example, moreover, the phase detectors currently not being used already carry out an adjustment of the phase shift, which in the event of their use as a PLL phase detector also contributes via the mixing at adder 25 to the initial adjustment immediately after the switch-over.

Diverging from the described example of embodiment, a different number of clock signals at the input and/or a different number of output clock signals can of course also be provided. Furthermore, the number and arrangement of frequency dividers 14, 16 can be adapted to the given application. The structure of phase detector PD shown in FIG. 2 represents a preferred embodiment, but could of course also be designed differently. Preference is however given to a structure by means of which (as in the case of the described structure) an internal phase locked loop can be provided inside the phase detector for the adjustment of the frequency shift and/or the phase shift in the second operating mode. As far as the phase shift as such is concerned, the described embodiment by means of a phase interpolator is also to be regarded solely as a preferred embodiment which could also be designed differently. The same also applies to the detailed design described below of sampler 32 on the one hand and phase interpolator 30 on the other hand, which could also have a different design from that described below.

Finally, the structure of PLL filter 24 shown in FIG. 1 is to be understood merely by way of example as a preferred embodiment. In this example, filter 24 comprises a proportional branch, which is formed from a linear element 45 with downstream low-pass filter 46, and an integral branch, which is formed from an integrator 47, wherein the signals resulting from the two branches are combined via an adder 48 to form the filter output signal.

Figure 3:
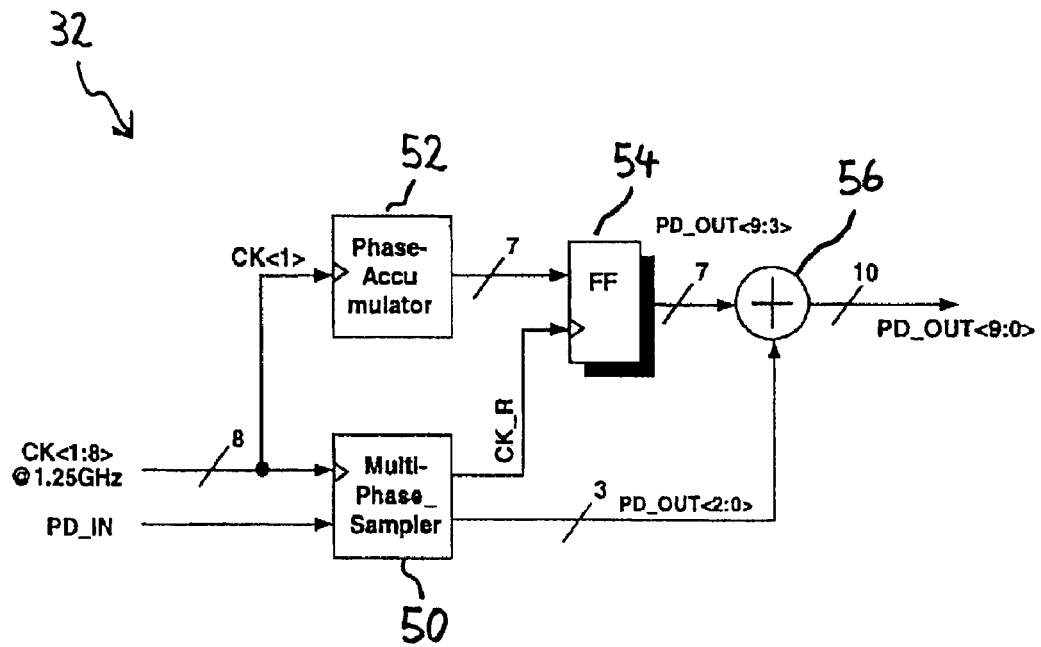
FIG. 3 shows the structure of a sampler device used in the phase detector from FIG. 2.

FIG. 3 shows the structure of the sampler device 32 used in phase detector PD from FIG. 2.

Phase-shifted version CK<1:8> of PLL output signal CKout and phase detector input signal PD_IN are inputted into a multiphase sampler 50, which generates therefrom signals CK_R and PD_OUT<2:0>. A signal component CK<1> of signal CK<1:8> consisting in total of eight signal components CK<1> to CK<8> is also inputted into a phase accumulator 52 (counter). A flip-flop arrangement 54 comprising seven flip-flops receives, as shown, a signal outputted by phase accumulator 52 as well as signal CK_R and forms a signal component PD_OUT<9:3> which, conveyed via a summation element 56 which further receives signal PD_OUT<2:0>, forms detector output signal PD_OUT<9:0>. In the example of embodiment shown, sampler device 32 generates at its output a 10-bit word, which represents digitally the phase difference of the signals fed to phase detector PD. Sampler device 32 comprises the multiphase sampler operating at high speed for making available signal PD_OUT<2:0>, which represents the three lowest-order bits of the phase detector output signal. Flip-flop arrangement 54 generates the 7 highest-order bits. The multiphase sampler samples the fed phase detector input signal PD_IN, which in the example shown has a frequency of 19.44 MHz, with the 8 uniformly spaced clock signals CK<1> to CK<8>, which in the example of embodiment shown have a frequency of 1.25 GHz and deliver a phase resolution of 100 ps.

Figure 4:
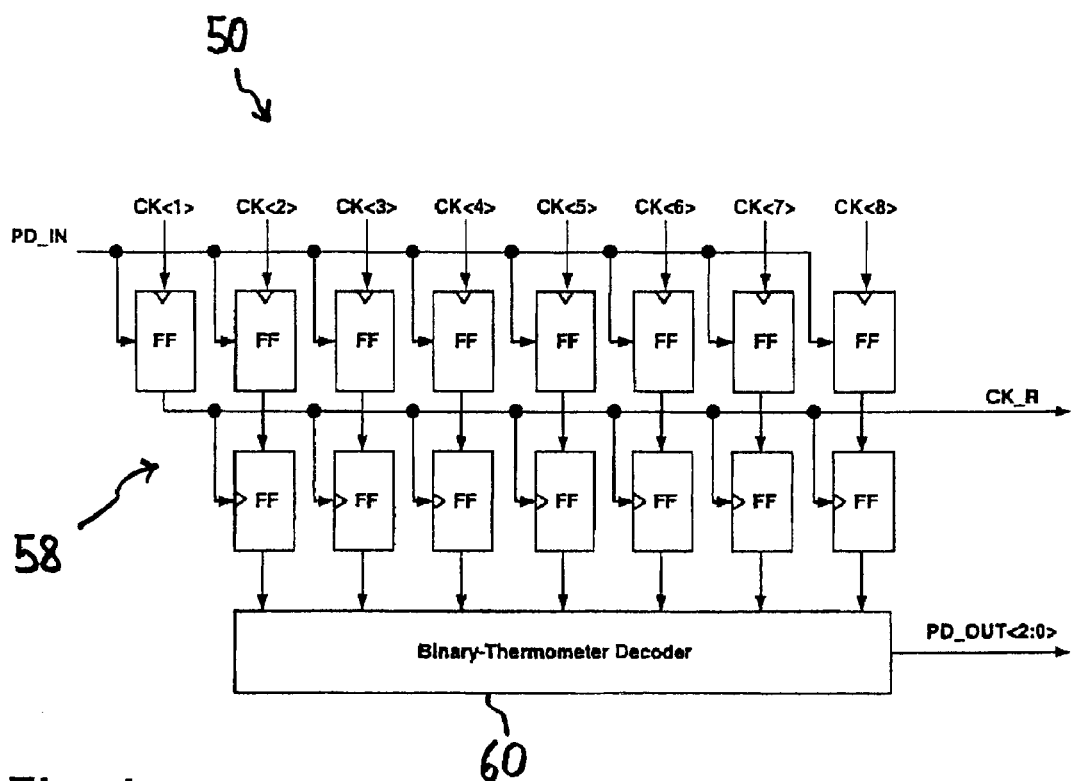
FIG. 4 shows the structure of a multiphase sampler used in the sampler device from FIG. 3.

FIG. 4 shows the structure of multiphase sampler 50 shown in FIG. 3. Multiphase sampler 50 contains, as shown, a flip-flop arrangement 58 and a decoder 60, which in the manner shown receive signals PD_IN and CK<1> to CK<8> and, at the output side, output signals CK_R and PD_OUT<2:0>.

Figure 5:
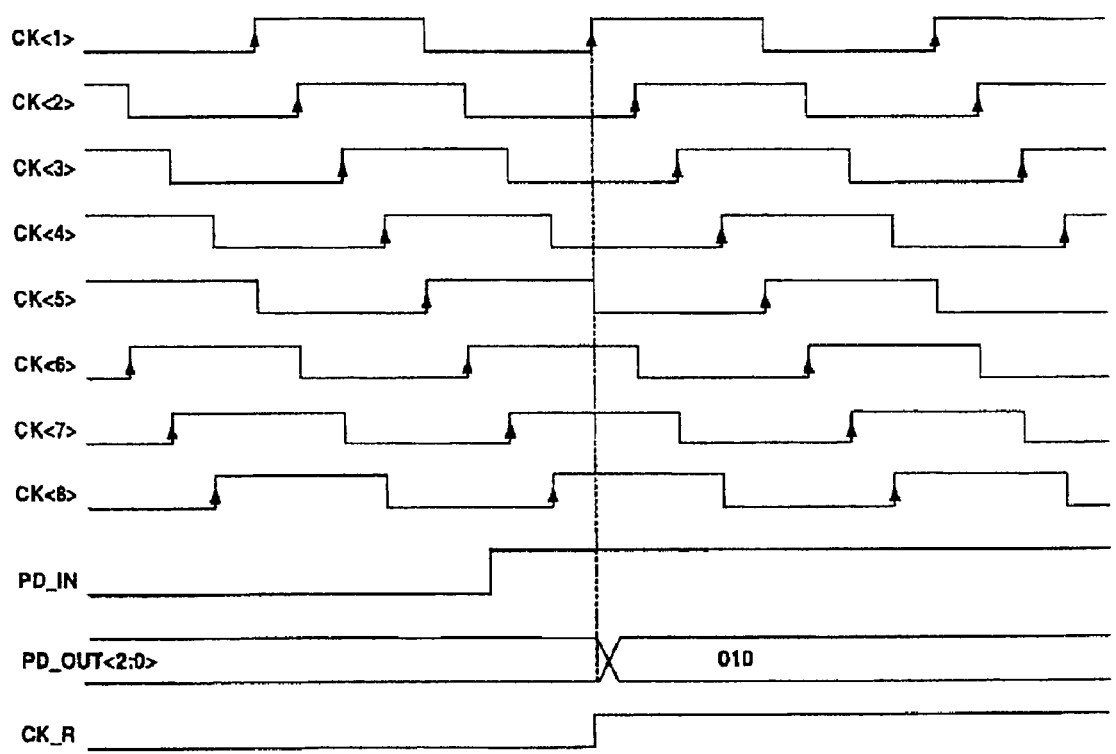
FIG. 5 shows an exemplary representation of the time characteristics of signals which occur at the multiphase sampler from FIG. 4.

FIG. 5 shows, by way of example, time characteristics of signal components CK<1> to CK<8>, signal PD_IN, signal PD_OUT<2:0> and signal CK_R. FIG. 5 shows in particular the phase relationship between the 8 sampling clock signals CK<1:8> and phase detector input signal PD_IN and phase detector output signal PD_OUT.

It can be seen from this that signal components CK<1> to CK<8> generated by phase interpolator 30 are in themselves identical signals, but equidistantly phase-shifted with respect to one another. In the example of embodiment shown, the timing offset between two neighbouring ones of the signal components (e.g. between CK<1> and CK<2>) corresponds to 100 ps.

Figure 6:
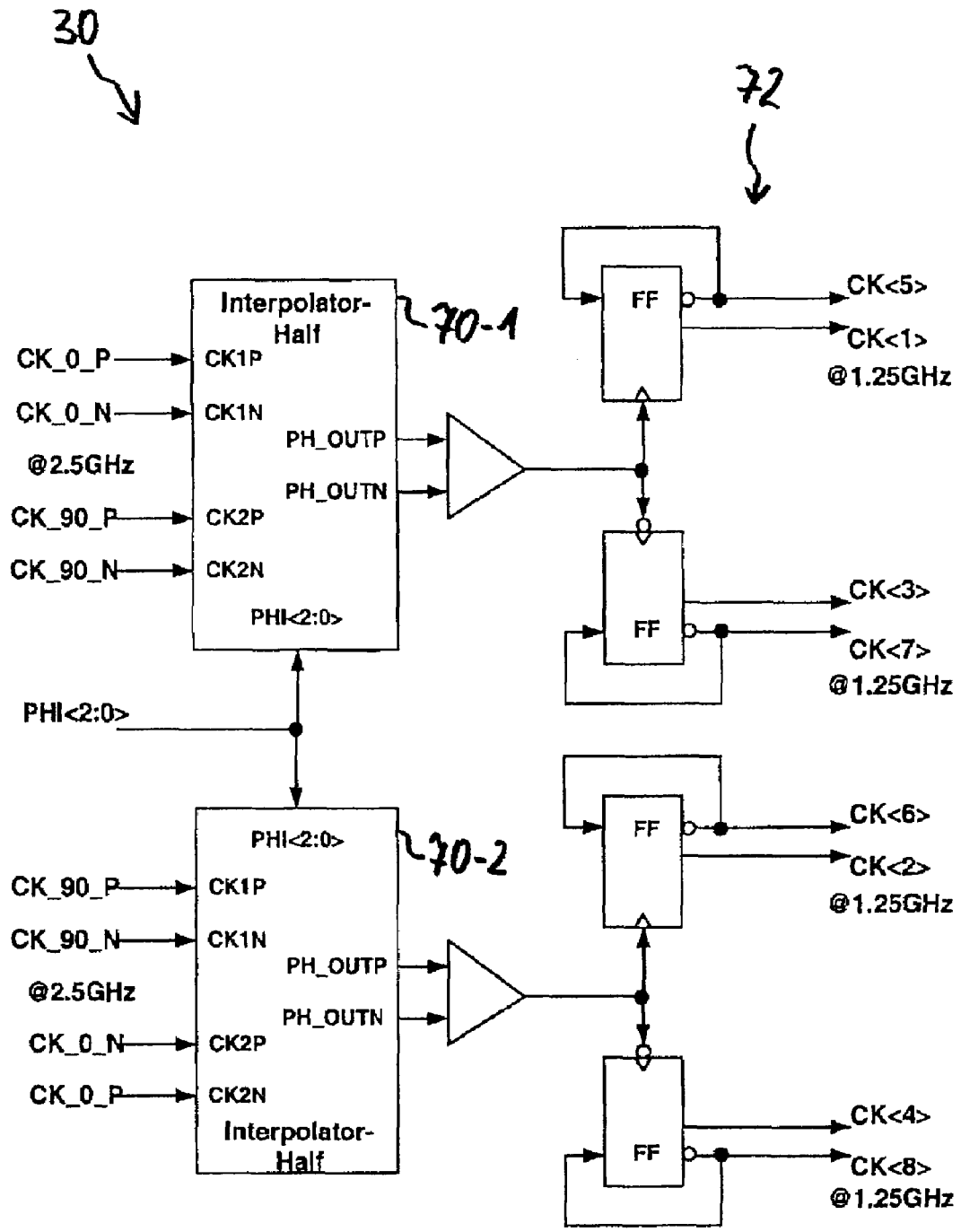
FIG. 6 shows the structure of a phase interpolator used in the phase detector from FIG. 2.
Figure 7:
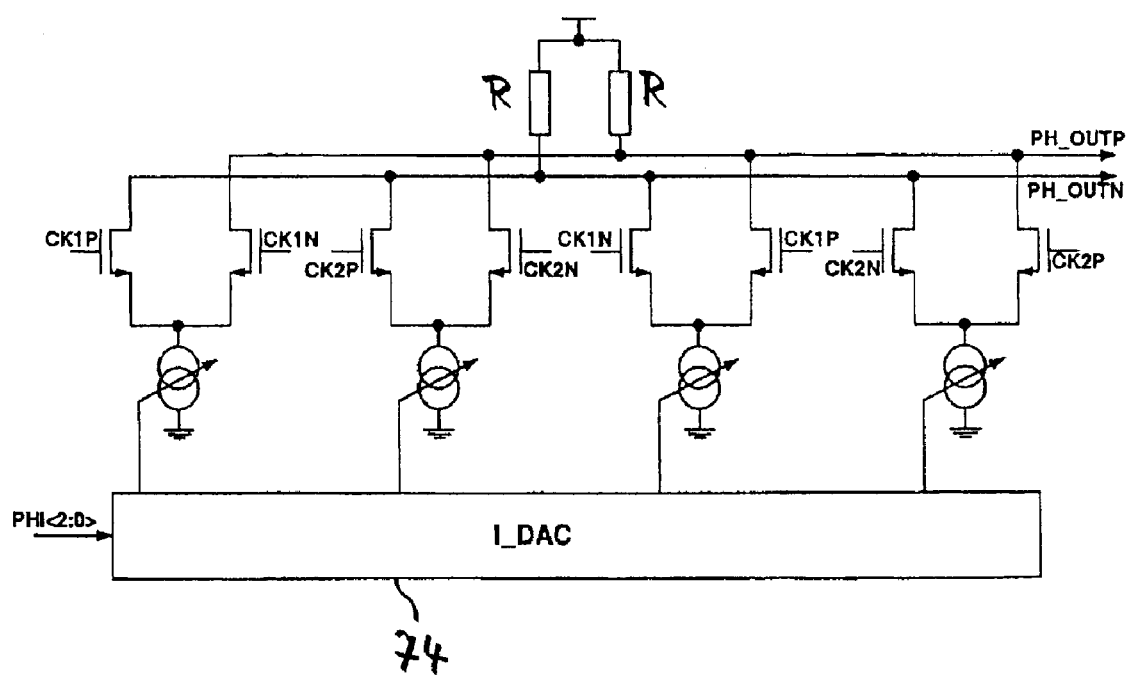
FIG. 7 shows the structure of two interpolator halves used in the phase interpolator from FIG. 6.

FIGS. 6 and 7 illustrate the structure of phase interpolator 30.

The overall structure of interpolator 30 is shown in FIG. 6. In order to make available the eight clock signals CK<1> to CK<8> spaced uniformly apart (by 100 ps) at a frequency of 1.25 GHz, interpolator 30 comprises the two represented interpolator halves 70-1 and 70-2 and an output circuit part 72 with additional divider circuits. Interpolator halves 70-1, 70-2 and interpolator output circuit part 72 cooperate in the manner shown, in order to form from quadrature signals CK_0 and CK_90 (cf. FIG. 1) the phase-shifted version of the PLL output signal, represented by signal components CK<1> to CK<8>.

Quadrature signals CK_0 and CK_90 are fed in differential form to interpolator 30: Signal CK_0 consists of differential signal components CK_0_P and CK_0_N. Signal CK_90 consists of differential signal components CK_90_P and CK_90_N. The adjustment of the desired phase shift takes place by means of signal PHI<2:0>. This is the signal transmitted in FIG. 2 by modulo-8-integrator 40 to the control input of phase interpolator 30.

Finally, FIG. 7 shows the (identical) structure of the two interpolator halves 70-1 and 70-2 shown in FIG. 6. The structure of each interpolator half follows a concept known per se and comprises a digital-to-analog converter 74, which converts fed signal PHI<2:0> into an analog current representation (symbolised by the represented current sources). The currents supplied by the current sources serve as adjusting currents for respective transconductance stages, which are each formed as shown by transistor pairs and bring about a weighted superposition of the individual currents. These currents are fed via a common resistive load R, so that potentials PH_OUTP and PH_OUTN shown in FIG. 6 are made available as a voltage drop at resistive load R. The phase interpolator output signal corresponds to the weighted sum of the CK1 and CK2 input signals formed (by current superposition), said input signals always having a phase difference of 90°. The resolution of the phase interpolator output signal is specified at 50 ps.

The frequency and time values stated for the example of embodiment described above are of course to be understood merely by way of example and can be modified in practice and adapted to the case of application concerned.

The invention claimed is:

1. A phase locked loop (12) with a controllable oscillator (DCO) for generating an output clock (CKout) of the phase locked loop and with a switch-over device (22) for switching over between a first clock signal (Ckin1) and a second clock signal (CKin2) for use as an input clock of the phase locked loop, comprising: (a) at least two phase detectors (PD1, PD2) which can be switched between different operating modes are provided respectively for the at least two input clock signals (Ckin1, CKin2), such that the phase detector (PD1 or PD2) for the clock signal (CKin1 or CKin2) currently being used as the input clock is put into a first operating mode and the phase detector (PD2 or PD1) for the clock signal (CKin2 or CKin1) currently not being used as the input clock is put into a second operating mode, (b) each phase detector (PD1, PD2) in the first operating mode determines a first-mode phase difference between the clock signal (CKin1 or CKin2) currently being used as the input clock and the output clock (CKout) and provides the first-mode phase difference for the control of the oscillator (DCO) to generate the output clock (CKout) and, (c) each phase detector (PD2, PD1) in the second operating mode determines a frequency difference between the clock signal (CKin2 or Ckin1) currently not being used as the input clock and the output clock (CKout), such frequency difference being stored and continuously updated and provided as a frequency adaptation control signal (INT_OUT) for the control of the oscillator (DCO) after the switch-over to this clock signal (CKin2 or CKin1) previously not being used as the input clock, so that any frequency jump during switch-over produces, by means of the frequency adaptation control signal (INT_OUT), a substantially immediate corresponding frequency adjustment of the oscillator (DCO), wherein each of the at least two phase detectors (PD1, PD2) has an integrator (41) responsive to a second-mode phase difference between the clock signal (CKin2 or Ckin1) currently not being used as the input clock and the output clock (CKout) to generate the frequency adaptation control signal (INT OUT), and wherein the second-mode phase difference inputted into the integrator (41) is provided as an output signal (PD OUT) of a phase comparison device (32), which compares the phase of the clock signal (CKin2 or Ckin1) currently not being used as the input clock with a phase-shift adjusted version (CK<1:8>) of the output clock (CKout), the phase shift of the phase-shift adjusted version (CK<1:8>) of the output clock (CKout) being adjusted on the basis of the frequency adaptation control signal (INT OUT) from the integrator (41).

2. A method for the operation of a phase locked loop (12), wherein a controllable oscillator (DCO) generates an output clock (CKout) of the phase locked loop and can be switched over between a first clock signal (Ckin1) and a second clock signal (CKin2) for use as an input clock of the phase locked loop, the phase locked loop including first and second phase detectors (PD1 and PD2) each operable in either a first or a second operating mode, comprising the steps: (a) in the first operating mode, for the clock signal (Ckin1 or CKin2) currently being used to generate the output clock (CKout), determining a first-mode phase difference between this clock signal and a first phase-shift adjusted version (CK<1:8>) of the output clock (CKout), and using the first-mode phase difference for the control of the oscillator (DCO) in generating the output clock (CKout), (b) in the second operating mode, for the clock signal (CKin2 or Ckin1) currently not being used to generate the output clock (CKout), adjusting the phase shift of a second phase-shift adjusted version (CK<1:8> of the output signal (CKout), and determining the frequency difference of the clock signal (CKin2 or Ckin1) currently not being used with respect to the output clock (CKout) and storing and continuously updating the frequency difference, and (c) providing the stored frequency difference as a frequency adaptation control signal (IN_OUT) for the control of the oscillator (DCO) after the switch-over to this clock signal (CKin2 or CKin1) previously not being used, so that any frequency jump during switch-over produces, by means of the frequency adaptation control signal (INT_OUT), a substantially immediate corresponding frequency adjustment of the oscillator (DCO), wherein, in the second operating mode, the phase-shift adjusted version (CK<1:8>) of the output clock signal (CKout) is adjusted on the basis of the frequency adaptation control signal.

3. A phase locked loop (12) with a controllable oscillator (DCO) for generating an output clock (CKout) of the phase locked loop and with a switch-over device (22) for switching over between a first clock signal (Ckin1) and a second clock signal (CKin2) for use as an input clock of the phase locked loop, comprising: (a) at least two phase detectors (PD1, PD2) which can be switched between different operating modes are provided respectively for the at least two input clock signals (Ckin1, CKin2), such that the phase detector (PD1 or PD2) for the clock signal (Ckin1 or CKin2) currently being used as the input clock is put into a first operating mode and the phase detector (PD2 or PD1) for the clock signal (CKin2 or Ckin1) currently not being used as the input clock is put into a second operating mode, (b) each phase detector (PD1, PD2) in the first operating mode determines a first-mode phase difference between the clock signal (Ckin1 or CKin2) currently being used as the input clock and the output clock (CKout), and provides the first-mode phase difference for the control of the oscillator (DCO) in generating the output clock and, (c) each phase detector (PD2, PD1) in the second operating mode determines a frequency difference between the clock signal (CKin2 or Ckin1) currently not being used as the input clock and the output clock (OKout), such frequency difference being stored and continuously updated and provided as a frequency adaptation control signal (INT_OUT) for the control of the oscillator (DCO) after the switch-over to this clock signal (CKin2 or CKin1) previously not being used as the input clock, so that any frequency jump during switch-over produces, by means of the frequency adaptation control signal (INT_OUT), a substantially immediate corresponding frequency adjustment of the oscillator (DCO), wherein each of the at least two phase detectors (PD1, PD2) has a phase comparison device (32) comparing the phases of the clock signal (Ckin1 or CKin2) currently being used as the input clock and a first phase-shift adjusted version (CK<1:8>) of the output clock signal (CKout) to provide the first-mode phase difference determined by each phase detector (PD1, PD2) in the first operating mode, and wherein each phase detector (PD1, PD2) in the second operating mode adjusts the phase shift of a second phase-shift adjusted version (CK<1:8>) of the output clock signal (CKout)on the basis of the frequency adaptation control signal (INT_OUT).

* * * * *

UNITED STATES PATENT AND TRADEMARK OFFICE
CERTIFICATE OF CORRECTION

PATENT NO. : 7,622,966 B2 Page 1 of 1
APPLICATION NO. : 11/751871
DATED : November 24, 2009
INVENTOR(S) : Heinz Werker It is certified that error appears in the above-identified patent and that said Letters Patent is hereby corrected as shown below:

In column 12, line 33, in Claim 3, please delete "(OK out)" and insert therefore --(CK out)--.

Signed and Sealed this

Twenty-sixth Day of January, 2010

David J. Kappos
*Director of the United States Patent and Trademark Office*